United States Patent [19]

Krauter et al.

[11] Patent Number: 5,506,457
[45] Date of Patent: Apr. 9, 1996

[54] ELECTRONIC SWITCH FOR DECOUPLING CAPACITOR

[75] Inventors: Byron L. Krauter; Peter J. Klim, both of Austin, Tex.; Tak H. Ning, Yorktown Heights; Stanley E. Schuster, Granite Springs, both of N.Y.; Lloyd A. Walls, Austin, Tex.

[73] Assignee: International Business Machines Corporation, Armonk, N.Y.

[21] Appl. No.: 418,971

[22] Filed: Apr. 7, 1995

[51] Int. Cl.⁶ ................................. H01H 83/20
[52] U.S. Cl. ................. 307/129; 307/98; 307/99; 324/537; 324/548; 361/306.2
[58] Field of Search .................. 307/129, 98, 99; 361/15, 306.2, 311; 324/537, 548

[56] References Cited

U.S. PATENT DOCUMENTS

| | | |
|---|---|---|
| 2,294,099 | 8/1942 | Trapp . |
| 2,488,454 | 11/1949 | Wallace et al. . |
| 3,319,120 | 8/1967 | Fahlen . |
| 3,573,549 | 4/1971 | Wolf . |
| 3,657,602 | 4/1972 | Boehm .......................... 317/12 R |
| 3,984,734 | 10/1976 | Becker . |
| 4,104,687 | 8/1978 | Zulaski . |
| 4,434,401 | 2/1984 | York ............................... 324/158 |
| 4,536,704 | 8/1985 | Burkum .............................. 324/52 |
| 4,935,836 | 6/1990 | Labbus et al. . |
| 5,394,294 | 2/1995 | Mei et al. ...................... 361/275.3 |
| 5,436,566 | 6/1995 | Thompson et al. ................. 324/713 |

Primary Examiner—William M. Shoop, Jr.
Assistant Examiner—Albert Paladini
Attorney, Agent, or Firm—Whitham, Curtis, Whitham & McGinn; Robert Tassinari

[57] ABSTRACT

An electronic switch circuit switches out bad decoupling capacitors on a high speed integrated circuit chip. The circuit comprises a control device that operates in the subthreshold or off device state to detect leakage in a decoupling capacitor. This control device operates in a low impedance state if the capacitor is good and in a high impedance sate if the capacitor is bad. A feedback circuit is connected from an internal node of the capacitor to a gate of the control device so that once a state of the capacitor is detected it can be stored on the gate of the control device. A single external signal source shared by a group of capacitors activates the control device to detect leakage in the capacitor. The circuit operates to switch out capacitors that fail during normal operation.

7 Claims, 2 Drawing Sheets

ELECTRONIC SWITCH FOR DECOUPLING CAPACITOR

BACKGROUND OF THE INVENTION

1. Field of the Invention

The present invention generally relates to high speed integrated circuit (IC) chips which experience large changes in current as circuits switch and, more particularly, to the addition of decoupling capacitors to limit $\Delta I$ noise without the attendant reduction in chip yield normally encountered with the addition of such decoupling capacitors.

2. Background Description

In high performance chips where there are large changes in current as circuits switch, it has become necessary to add capacitance between the power supply and ground leads to limit $\Delta I$ noise. This capacitance can be formed from normal device thin oxide. However, any defects in this added thin oxide can result in high leakage currents or shorts due to defective capacitors, lowering chip yield and greatly increasing the cost of production of high performance chips.

SUMMARY OF THE INVENTION

It is therefore an object of the present invention to provide decoupling capacitors for high performance IC chips to limit $\Delta I$ noise without the attendant reduction in chip yield normally encountered with the addition of such decoupling capacitors.

According to the invention, there is provided an electronic switch consisting of a device in series with a capacitor so that only good capacitors are connected. The bad capacitors are switched out automatically by means of feedback at each capacitor. The circuit comprises a control device that operates in the subthreshold or off device state to detect leakage in a decoupling capacitor. This control device operates in a low impedance state if the capacitor is good and in a high impedance sate if the capacitor is bad. A feedback circuit is connected from an internal node of the capacitor to a gate of the control device so that once a state of the capacitor is detected it can be stored on the gate of the control device. A single external signal source shared by a group of capacitors activates the control device to detect leakage in the capacitor. The circuit operates to switch out capacitors that fail during normal operation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
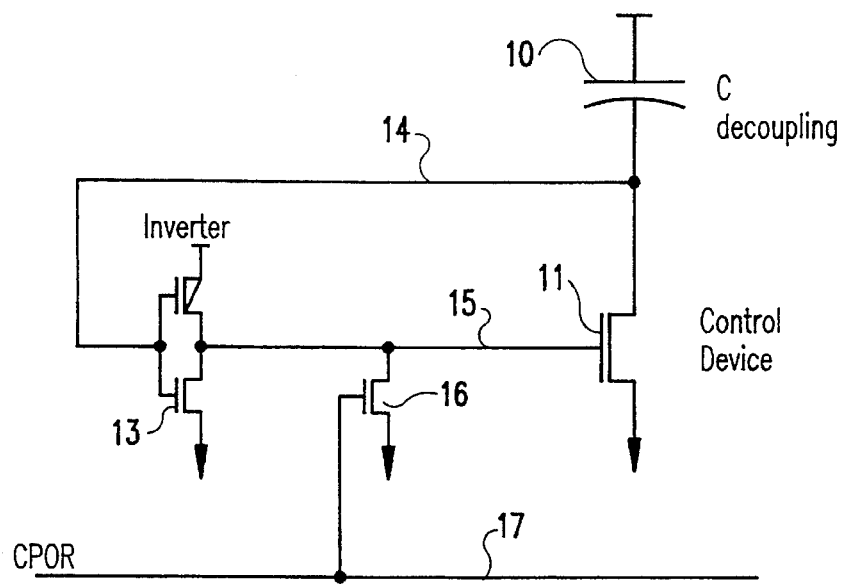
FIG. 1 is a schematic diagram showing the equivalent circuit of the chip structure according to a preferred embodiment of the invention.

Referring now to the drawings, and more particularly to FIG. 1, there is shown the equivalent circuit of the structure according to a preferred embodiment of the invention. The circuit consists of the decoupling capacitor 10, an n-channel control device 11 in series with the capacitor and ground, an inverter composed of p-channel device 12 and n-channel device 13 connected between the shared node 14 of the capacitor and control device 11 and node 15 connected to the gate of the control device, and a further n-channel device 16 connected between node 15 and ground with its gate connected to a common line 17 that is connected to each capacitor circuit.

Figure 3:
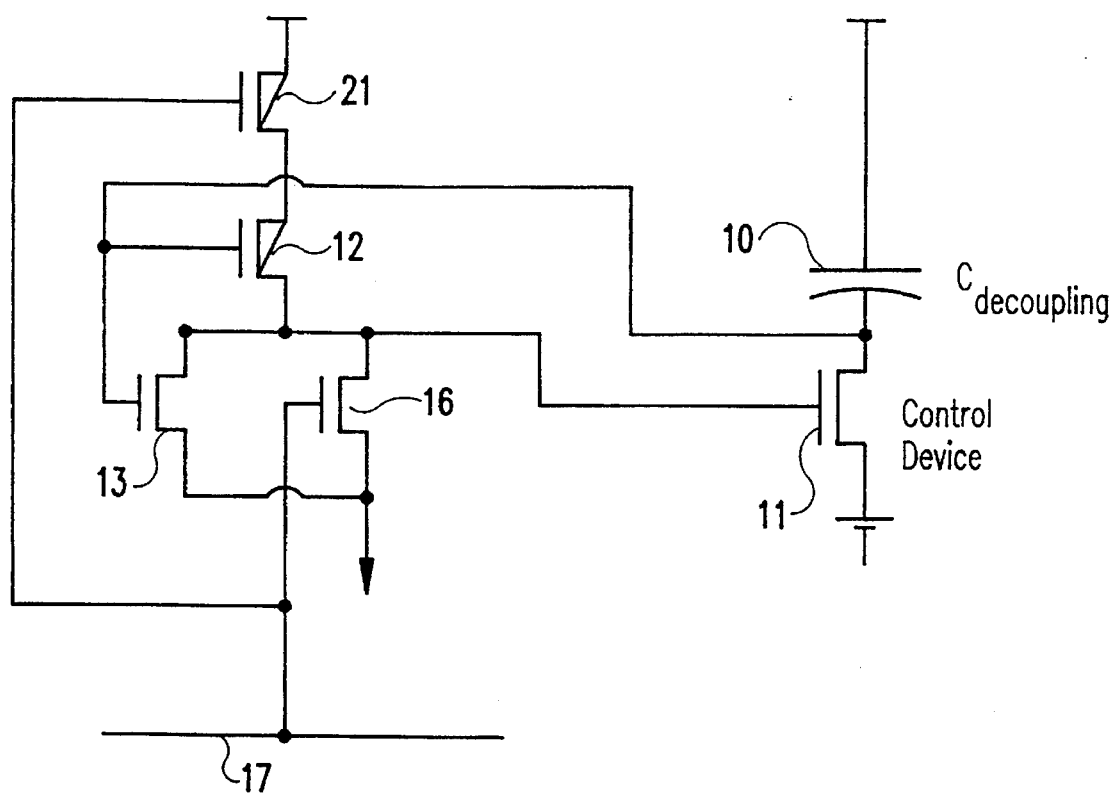
FIG. 3 is a schematic diagram showing the equivalent circuit of a second embodiment of the invention incorporating a NOR gate.

During chip power up, a Capacitor Power On Reset (CPOR) signal is applied to the common line 17 connected to the gate of device 16. CPOR is switched high, causing node 15 to go low and thereby turning off control device 11 except for a small amount of subthreshold conduction current. This current is in the range of 0.1 pA to 0.1 nA per micron of channel width (variation around minimum channel length at 25° C.). If the capacitor 10 is good, the leakage through the oxide will be extremely small (<<fA) and node 14 will leak to a low level through the control device 11 in about 0.002 to 1 second, depending on the channel length of the control device. If the capacitor is bad or leaky (>1 nA to short), node 14 will quickly rise to a high level. The only requirement on device sizes it that n-channel device 16 must be strong enough to pull node 15 low when node 14 is low and p-channel device 12 is attempting to pull node 14 high. Making devices 12 and 13 minimum width devices and device 16 twice minimum width should work well and provide adequate margin. This should give a four fold difference in current between device 12 and device 16 (i.e., twice the difference from the width and twice the difference from the transconductance) insuring that node 15 goes low. At the cost of an additional p-channel device, this requirement could be eliminated. The added p-channel device 21 would be in series with device 12 and with its gate connected to the global CPOR line 17 as shown in FIG. 3.

For the case of a good capacitor, node 14 will be low and when the CPOR signal goes low, node 15 will be pulled high through the inverter p-channel device 12, causing the control device 11 to turn on. Thus, the good capacitor is switched on. If the capacitor 10 is bad, node 14 will be high and when the CPOR signal goes low, node 15 is held low through device 13 of the inverter and the control device 11, and hence the capacitor, is off. For the case where the leakage of the capacitor 10 is about the same as the subthreshold current of the control device 11, node 14 could be in an intermediate state when the CPOR signal goes low. If the intermediate voltage on node 14 is above the switching voltage of the inverter and is rising with time, the control device 11 will remain off and the capacitor 10 is switched off. Conversely, if the intermediate voltage on node 14 is above the switching voltage of the inverter but falling with time, the inverter will switch when the voltage on node 14 reaches the switching voltage of the inverter. When this happens, node 15 will rise and the control device 11 will turn on, switching on the capacitor 10. The capacitor 10 will also be switched on if the voltage on node 14 is at an intermediate level below the switching voltage of the inverter when the CPOR signal goes low.

Only those capacitors which have lower leakage than the subthreshold conduction of the control device 11 will be switched on after the CPOR signal goes low. If during normal operation a capacitor fails, it will be switched out if its leakage is large enough to cause node 14 to rise above the inverter switching voltage. This provides protection against any high leakage fails that occur after the initial CPOR cycle. Of course, the procedure of pulsing CPOR high could be repeated at any time after the chip is powered up providing it does not interfere with normal chip operation.

Figure 2:
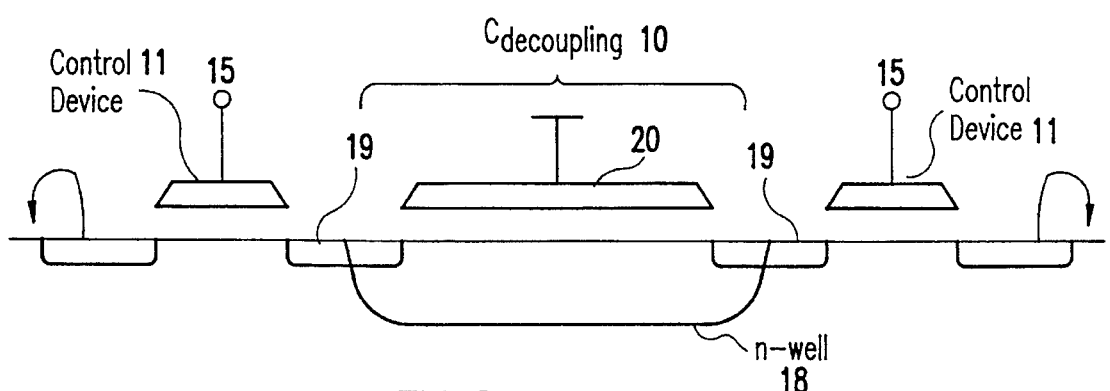
FIG. 2 is a cross-sectional representation of the chip structure for the capacitor and the control device.

In order for the electronic switch to work, it has been assumed that if the capacitor 10 is leaky or shorted that the only path for current to flow is through the control device 11. High leakage to the substrate from the capacitor plate 20 connected to the power supply is a concern and a potential problem. This can be avoided by placing the capacitor 10 in an n-well 18 as shown in the cross-section of the capacitor and control device 11 shown in FIG. 2. Assuming the substrate is at ground, the only paths from the capacitor 10 to ground are through the off device current of the control device 11 and through the reversed biased n-well 18 and drain junction 19 of the control device. Thus, by placing the capacitor in the n-well, the potential of a high leakage path to substrate is eliminated, and the circuit operates as described. Any additional leakage from the n-well and device drain diffusion will add to the control device subthreshold leakage and will help speed up the discharge of node 14 if the capacitor 10 is good.

Figure 4:
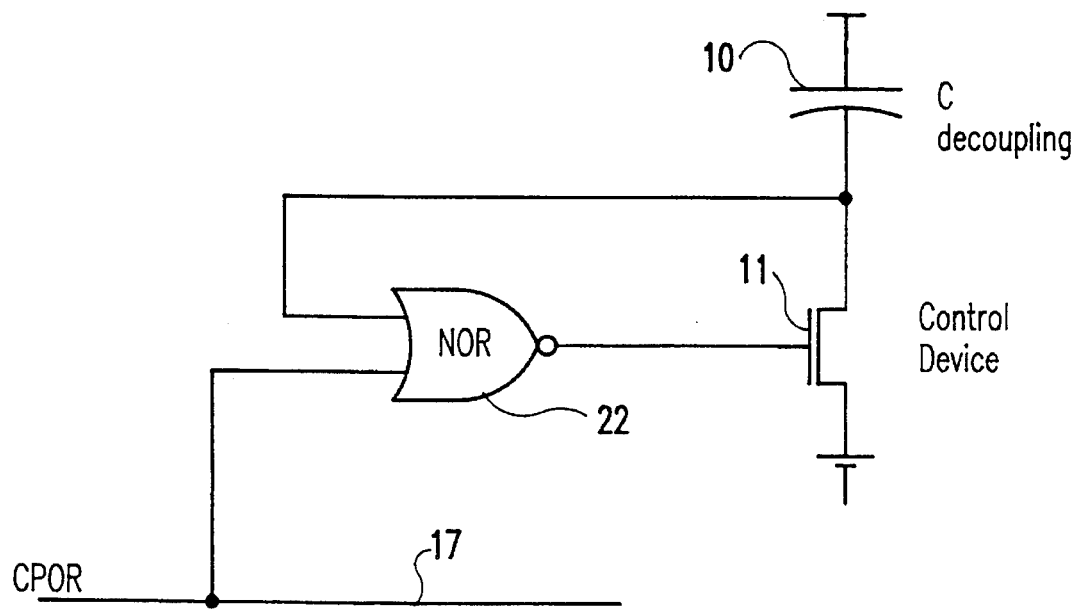
FIG. 4 is a schematic and logic diagram the circuit of FIG. 3.

In an alternative embodiment shown in FIG. 3 and FIG. 4, a classic NOR gate is formed by the addition of a p-channel device 21. In FIG. 3, the same reference numerals are used to reference the same components as in FIG. 1. This embodiment adds a second p-channel device 21 in series with p-channel device 12. The gate of p-channel device 21 is connected to line 17. Thus, the line 17 carrying the CPOR signal comprises one input of the NOR gate 22 shown in FIG. 4, while the junction of the capacitor 10 and the control device 11 comprises the second input to the NOR gate. Without the additional p-channel device 21, it is possible to pass a significant amount of current during initial turn on through devices 12 and 16 of many parallel circuits of this type. The NOR gate configuration significantly reduces this current by eliminating the path for current.

The foregoing description assumes a capacitor formed by planar thin oxide. The same technique is applicable to capacitors formed by other means, including between metal layers or using trenches.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electronic switch for switching out bad decoupling capacitors on a high speed integrated circuit chip comprising:

a control device that operates in the subthreshold or off device state to detect leakage in a decoupling capacitor, said control device operating in a low impedance state if the capacitor is good and in a high impedance sate if the capacitor is bad;

a feedback circuit from an internal node of the capacitor to a gate of the control device so that once a state of the capacitor is detected it can be stored on the gate of the control device; and a single external signal source shared by a group of capacitors that activates the control device to detect leakage in the capacitor.

2. The electronic switch recited in claim 1 wherein said feedback circuit comprises an inverter, said inverter switching out capacitors that fail during normal operation.

3. The electronic switch recited in claim 2 wherein said control device is an n-channel device, further comprising a second n-channel device connected between the gate of said control device and ground, said second n-channel device having a gate connected to said external signal source.

4. The electronic switch recited in claim 3 wherein said inverter comprises a p-channel device and a third n-channel device, said p-channel device having a width less than said second n-channel device.

5. The electronic switch recited in claim 4 wherein the capacitor is formed in an n-well of a chip substrate with said control device surrounding the capacitor so that leakage current paths for the capacitor are limited to paths through said control device and through a reversed biased n-well and drain junction of said control device.

6. The electronic switch recited in claim 4 further comprising a second p-channel device connected in series with said first mentioned p-channel device, said second p-channel device having a gate connected to said external signal source, said two p-channel devices and said second and third n-channel devices forming a NOR gate.

7. The electronic switch recited in claim 6 wherein the capacitor is formed in an n-well of a chip substrate with said control device surrounding the capacitor so that leakage current paths for the capacitor are limited to paths through said control device and through a reversed biased n-well and drain junction of said control device.

* * * * *